United States Patent [19]
Yoshino et al.

[11] Patent Number: 5,966,050
[45] Date of Patent: Oct. 12, 1999

[54] CLASS B PUSH-PULL DIFFERENTIAL AMPLIFIERS OF THE SINGLE-END OUTPUT

[75] Inventors: Hiroshi Yoshino; Sakiko Miura, both of Yokohama, Japan

[73] Assignee: Kabushiki Kaisha Toshiba, Kawasaki, Japan

[21] Appl. No.: 09/112,507

[22] Filed: Jul. 9, 1998

[30] Foreign Application Priority Data

Jul. 10, 1997 [JP] Japan .................................. 9-185118

[51] Int. Cl.$^6$ .................................. H03F 3/45; H03F 1/14
[52] U.S. Cl. .......................... 330/255; 330/257; 330/292
[58] Field of Search ................................. 330/255, 257, 330/292, 311

[56] References Cited

U.S. PATENT DOCUMENTS

| | | | |
|---|---|---|---|
| 4,783,602 | 11/1988 | Viswanathan | 330/255 |
| 4,902,984 | 2/1990 | Vinn et al. | 330/257 |
| 5,736,892 | 4/1998 | Lee | 330/257 |
| 5,838,149 | 11/1998 | Perraud | 330/257 |

Primary Examiner—Robert Pascal
Assistant Examiner—Patricia T. Nguyen
Attorney, Agent, or Firm—Oblon, Spivak, McClelland, Maier & Neustadt, P.C.

[57] ABSTRACT

A differential amplifier includes an input differential pair constituted by differential pair transistors whose common emitter is current-biased by a negative voltage source through a constant current source. An active load is formed by interconnecting through resistors input and output of a first and second current mirror circuit whose emitters serve as positive voltage sources. A collector output of each of the input differential pair is connected to each of the outputs of the first and second current mirror circuits. An output current amplifying stage comprises three emitter-grounded current amplifying stages whose emitters serve as positive voltage sources. The first current amplifying stage includes a capacity provided between the base and collector thereof and connected to one of current mirror outputs of the active load at the base thereof. The second and third current amplifying stages are connected to the other current mirror output of the active load at a common base. One of collector outputs thereof is connected to a negative voltage source through a resistor with a capacity provided between the base and collector. The other collector output is connected to the input of a third current mirror circuit whose emitters serve as negative voltage sources.

4 Claims, 4 Drawing Sheets

CLASS B PUSH-PULL DIFFERENTIAL AMPLIFIERS OF THE SINGLE-END OUTPUT

BACKGROUND OF THE INVENTION

The present invention relates to a differential amplifier and, more particularly, to a class B push-pull differential amplifier of the single-end output type configured to have a single current amplifying stage.

A configuration as shown in FIG. 6 has been used for class B push-pull differential amplifiers of the single-end output type configured to have a single current amplifying stage.

As shown in FIG. 6, this configuration includes a first differential pair formed by n-p-n transistors Q1 and Q2 having a common emitter to which current bias is applied by a constant current source I1 and a second differential pair formed by n-p-n transistors Q3 and Q4 having a common emitter to which current bias is applied by a constant current source I2 and in which current mirror circuits respectively formed by p-n-p transistors Q5, Q6 and Q7, Q8 are respectively provided at collector outputs of each of the first and second differential pairs as active loads to form a differential current output. Further, emitter grounded current amplifying stages formed by p-n-p transistors Q9 and Q10 are provided as output current amplifying stages, and the differential current output from the preceding stage is connected to an input base end of each of the output current amplifying stages. In addition, the input of a current mirror circuit formed by n-p-n transistors Q11 and Q12 is connected to a collector thereof serving as an inverted current output, and the output of the same is connected to a collector serving as a non-inverted current output, thereby providing a single-end output. A capacity C1 is provided between the base and collector of the output current amplifying stage (the p-n-p transistor Q10) whose collector serves as an direct output to provide phase compensation for preventing oscillation.

FIG. 7 shows a configuration wherein a negative feedback is provided to the above-described differential amplifier to use it as a voltage amplifier. In FIG. 7, a negative power supply terminal VEE is set at a ground potential, and a voltage source VCC is provided at a positive power supply terminal VCC. Further, a voltage source VBIAS is provided at a non-inverted input IN(+) to apply current bias through a resistor RIN, and a feedback resistor RNF1 is provided between an output OUT and an inverted input IN(−). Furthermore, a signal voltage source VIN is connected to the non-inverted input IN(+) as an input through a DC interrupting capacity CIN; one end of a resistor RNF2 is connected to the inverted input IN(−) to set a voltage gain; and the other end of the resistor RNF2 is connected to the ground potential through a DC interrupting capacity CNF. Referring to the extraction of output, a load resistor RLOAD which is at the ground potential at one end thereof is connected to the output end through a DC interrupting capacity COUT to form a voltage amplifier.

The above-described class B push-pull differential amplifier has a first problem in that the phase compensation for preventing oscillation is not sufficiently effective. In the circuitry shown in FIG. 6, the capacity 1 for phase compensation is inserted only in one of the current amplifying stages. Therefore, when it is assumed that a negative feedback is to be provided, the phase margin can fall short to cause oscillation in a state wherein the current amplifying stage including the current mirror circuit primarily undertakes the current amplifying operation. This problem can be mitigated to some degree by adding a capacity (capacity C2 indicated by the broken line) between the base and collector of the other current amplifying stage to achieve phase compensation. However, since the collector is connected to the input of the current mirror circuit in which the voltage transition is compressed relative to the signal current, the amount of high frequency components reduced as a result of the feedback from the collector to the base will be insufficient. In order to perform compensation with a sufficient phase margin, a large capacity is required in this region. This can increase the capacity which is less suitable for integration into an IC, resulting in an increased chip size.

There is a second problem in that the above-described conventional class B push-pull differential amplifier is subjected to significant fluctuation of the bias current (idling current) at the output stage. In the circuitry shown in FIG. 6, the bias current at the output stage is determined as follows. When the bias currents of the transistors of the input differential pair are balanced in a non-signal state, an offset current equivalent to the base current of the active load current mirror circuit provided at the collector output thereof is produced at the output of this stage. As a result, the current at the input base end of the emitter grounded current amplifying stage provided at the next stage is biased by the offset current from the preceding stage. Therefore, if the transistors forming the current mirror circuit at the input are matched with the transistors forming the output current amplifying stage, the current at the output current amplifying stage is biased by a current equivalent to the bias current of the input current mirror circuit.

Although a current gain inherent to the transistors is maintained at the current amplifying stage, variation of the bias current at the output stage during manufacture tends to increase when it is integrated into an IC because the bias current of the output stage depends on the matching between the current gains of the transistors. When the bias is extremely small, crossover distortion unique to a class B differential amplifier can occur.

BRIEF SUMMARY OF THE INVENTION

It is therefore an object of the invention to provide a differential amplifier in which a current amplifying stage maintains a current gain inherent to transistors, which is stable with respect to oscillation and which has less variation of the output current.

In order to achieve the above-described object, according to the present invention, there is provided a differential amplifier comprising:

an input differential pair constituted by differential pair transistors whose common emitter is current-biased by a negative voltage source through a constant current source;

an active load which is formed by interconnecting through resistors input and output of a first and second current mirror circuit constituted by transistors having conductivity opposite to that of the differential pair whose emitters serve as positive voltage sources and in which a collector output of each of the input differential pair is connected to each of the outputs of the first and second current mirror circuits; and an output current amplifying stage comprising three emitter-grounded current amplifying stages including a first, a second, and a third current amplifying stages which are formed using transistors having the same conductivity as the transistors forming the active load and whose emitters serve as positive voltage sources, the first current amplifying stage including a capacity provided between the base and collector thereof and connected to one of current mirror outputs of the active load at the base thereof, the second and third current amplifying stages being connected to the other current mirror output of the active load at a common base, and each of collectors output, one of collector outputs thereof being connected to a negative voltage source through a resistor with a capacity provided between the base and collector, the other collector output being connected to the input of a third current mirror circuit formed using transistors having the same conductivity as the differential pair transistors whose emitters serve as negative voltage sources, wherein the output of the third current mirror circuit is connected to the output collector of the first current amplifying stage to provide a single-end output.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the drawings.

Figure 1:
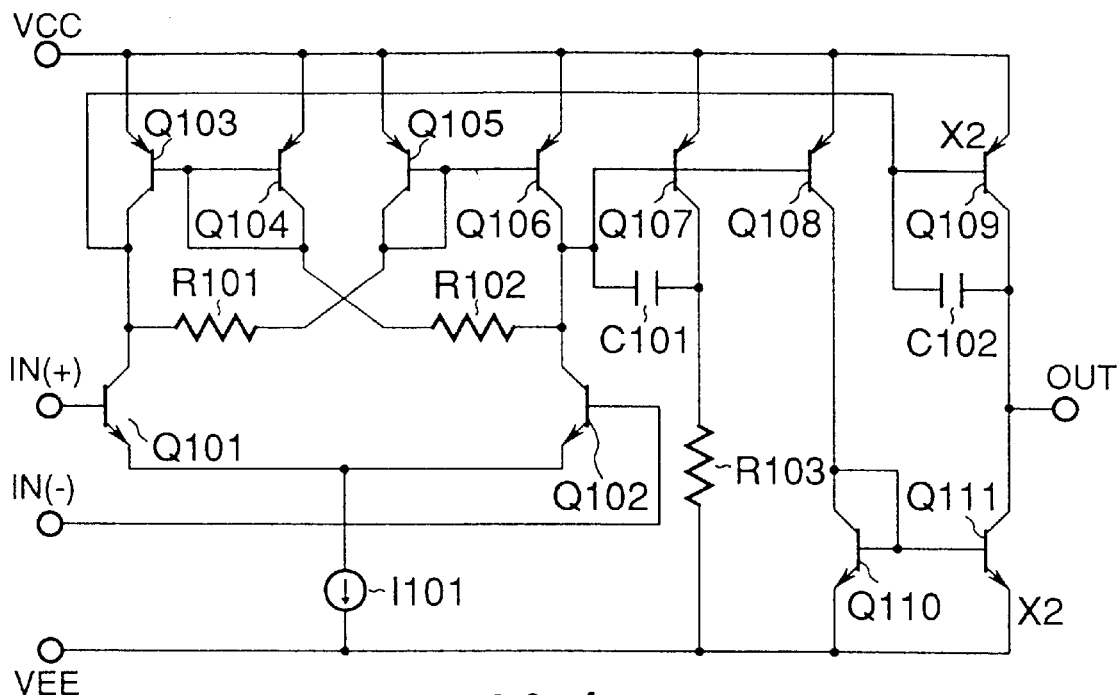
FIG. 1 is a diagram showing a configuration of a class B push-pull differential amplifier according to a first embodiment of the invention.

FIG. 1 is a diagram showing a configuration of a class B push-pull differential amplifier according to a first embodiment of the invention. As shown in FIG. 1, this configuration includes an input differential pair formed by n-p-n transistors Q101 and Q102 having a common emitter to which current bias is applied by a constant current source I101. Further, an active load is formed by interconnecting the input and output of current mirror circuits formed by p-n-p transistors Q103, Q104 and Q105, Q106, respectively through resistors R101 and R102. The output of each of the current mirror circuits is connected to each of the collector outputs of the differential pairs to provide a differential voltage output.

There is further provided an emitter-grounded output current amplifying stage formed by p-n-p transistors Q108 and Q109, and each of the input base ends of this output current amplifying stage is connected to the differential voltage output from the preceding stage.

An emitter-grounded output current amplifying stage formed by a p-n-p transistor Q107 whose collector is grounded to a minimum voltage through a resistor R103 is added to the output current amplifying stage serving as an inverted current output such that they share a base. The p-n-p transistor Q107 is a phase compensation transistor for preventing oscillation.

A capacity C101 is provided between the base and collector of the p-n-p transistor Q107, and a capacity C102 is provided between the base and collector of the output current amplifying stage serving as a non-inverted current output.

Further, the collector output of at the end of the inverted current output (p-n-p transistor Q109) is folded by a current mirror circuit formed by n-p-n transistors Q110 and Q111 to be connected to the collector output at the side of the non-inverted current output (p-n-p transistor Q108) to provide a single-end output. The current mirror circuit constitutes an output stage.

According to the present embodiment, the ratio between the surface areas of the emitters of the transistors forming the output current output stage, i.e., the emitter surface area ratio between the phase compensation transistor (p-n-p transistor Q107), the transistor outputting an inverted current (p-n-p transistor Q109) and the transistor outputting a non-inverted current (p-n-p transistor Q108) is 1:1:2. This doubles the current gain of the folded current mirror circuit at the output stage to match the current gains at the output current amplifying stages.

A second embodiment of the invention will now be described. The second embodiment is an embodiment intended for operation at a low current, whereas the above-described first embodiment is a basic embodiment.

In order to operate the input differential pair as an n-p-n transistor at a power supply voltage Vcc on the order of 1V, it is common to use an input bias voltage fixed by a saturation voltage Vsat=0.15V of the transistors in addition to a forward bias voltage Vbe=0.7V of the transistors. However, since the DC current at the output is also fixed by the bias potential at the input, the current gain at the output current amplifier stage is reduced when it is constituted by p-n-p transistors which tend to saturate quickly due to a reduced voltage, and the reduced voltage accelerates the deterioration of the amplifier characteristics. For this reason, it is necessary to use a current mirror circuit as an output current amplifying stage in this region which is capable of suppressing the effect of reducing the current gain of the transistors. Thus, a circuit for folding a signal current is added such that the output current amplifying stage is formed by n-p-n transistors where the input stage is formed by n-p-n transistors.

Figure 2:
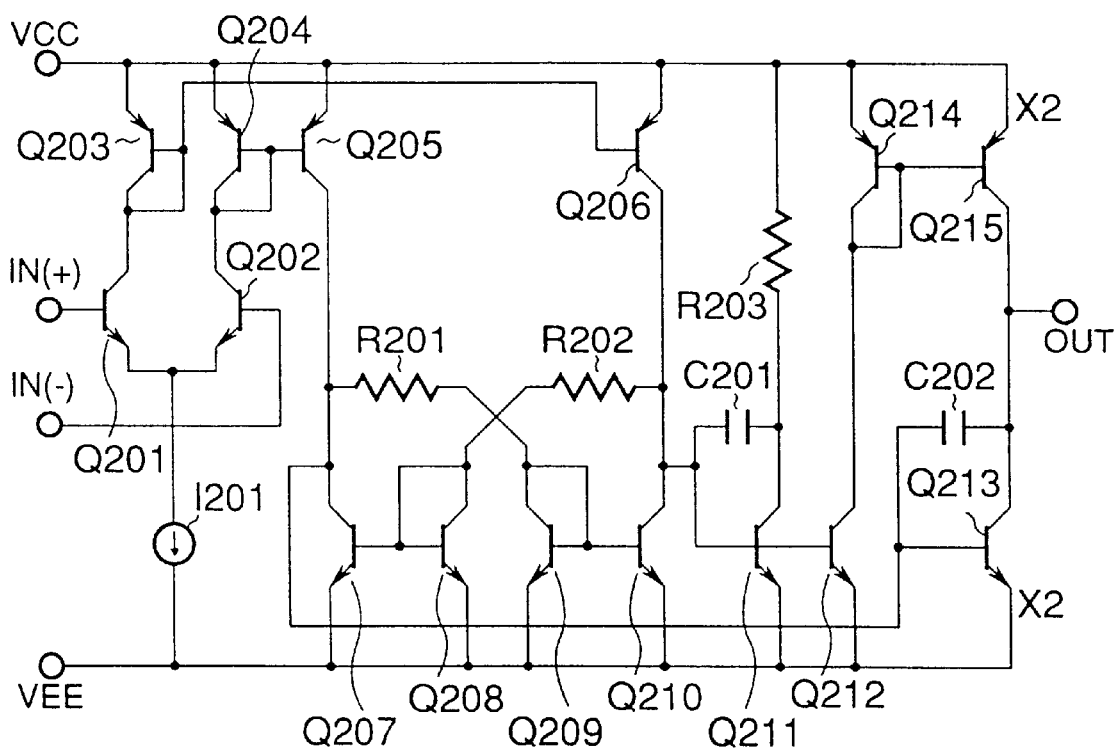
FIG. 2 is a diagram showing a configuration of an embodiment of the invention intended for operation at a low voltage.

FIG. 2 is a diagram showing a configuration of an embodiment intended for operation at a low voltage. A current mirror circuit (p-n-p transistors Q203 and Q206 or Q204 and Q205) is added at the input differential pair as a means for transfer to the active load to achieve folding.

Figure 3:
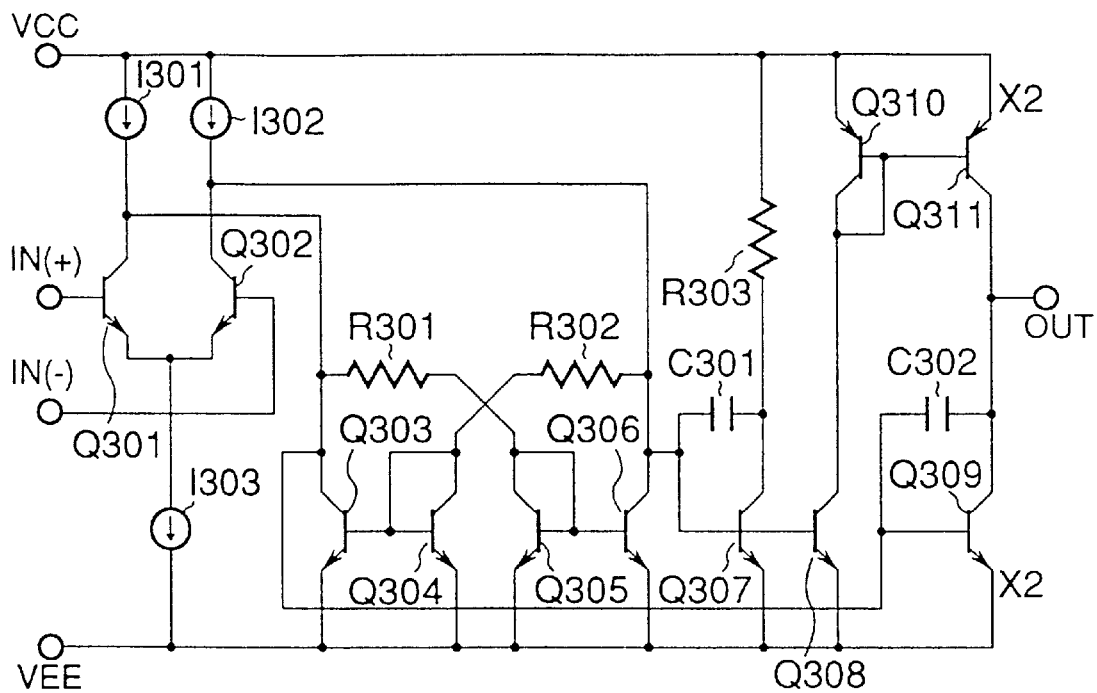
FIG. 3 is a diagram showing a configuration of another embodiment of the invention intended for operation at a low voltage.

FIG. 3 is a diagram showing a configuration of another embodiment intended for operation at a low voltage wherein constant current sources (I301 and I302) are provided at the input differential pair as a means for transfer to the active load to achieve folding.

Figure 4:
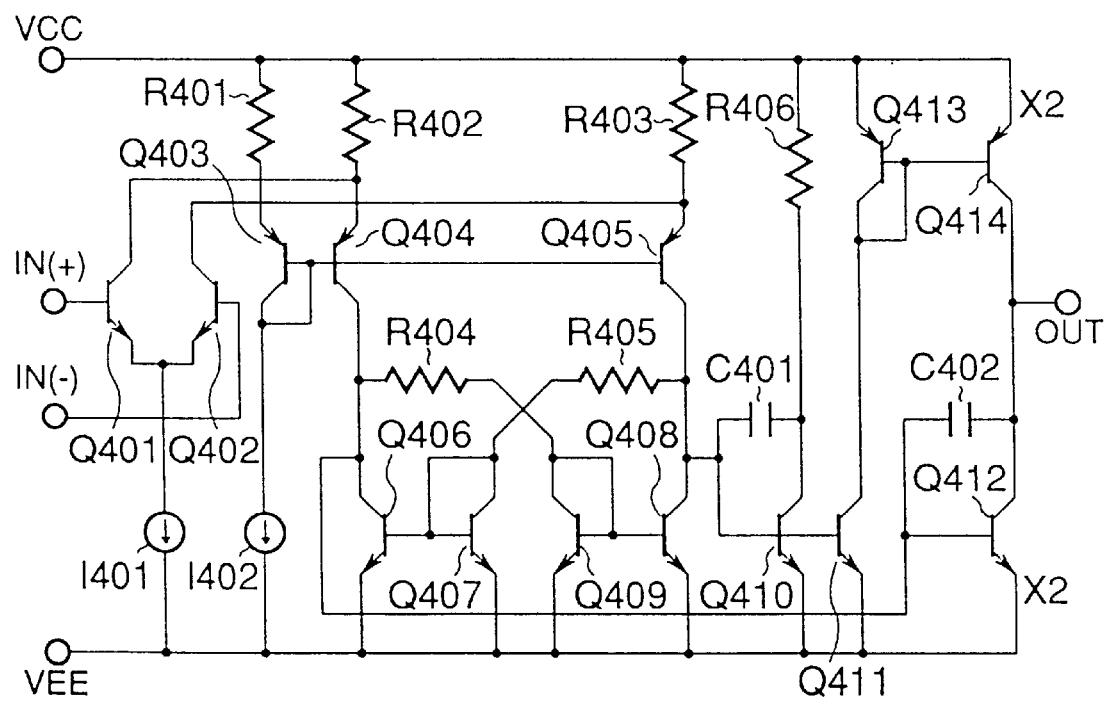
FIG. 4 is a diagram showing a configuration of still another embodiment of the invention intended for operation at a low voltage.

FIG. 4 is a diagram showing a configuration of still another embodiment intended for operation at a low voltage wherein base-grounded transistors (Q404 and Q405) are provided at the input differential pair as a means for transfer to the active load to achieve folding in the form of cascade connection.

Figure 5:
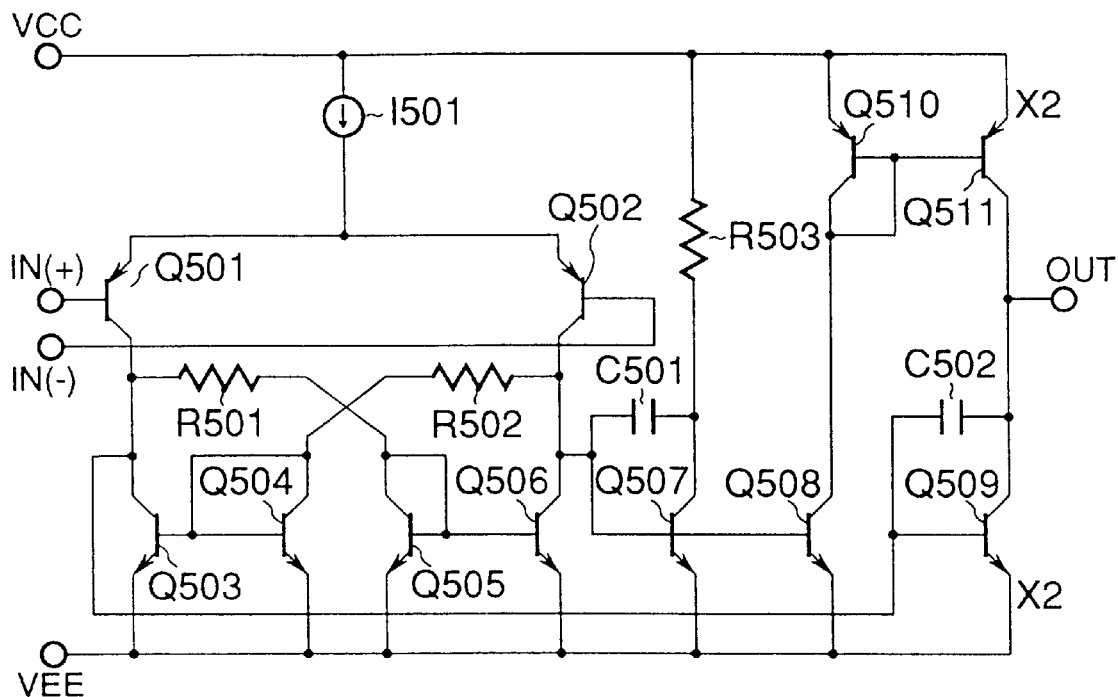
FIG. 5 is a diagram showing a configuration obtained by reversing the conductivity of the transistors in the configuration in FIG. 1.
Figure 6:
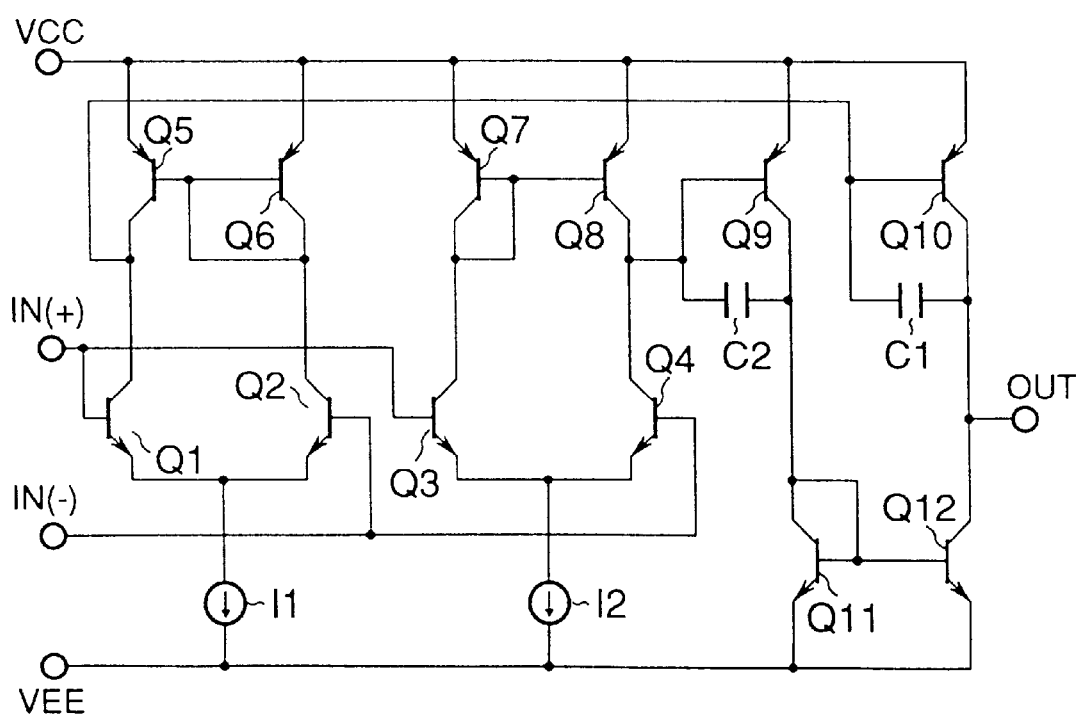
FIG. 6 is a diagram showing a class B push-pull differential amplifier having a single-end output.
Figure 7:
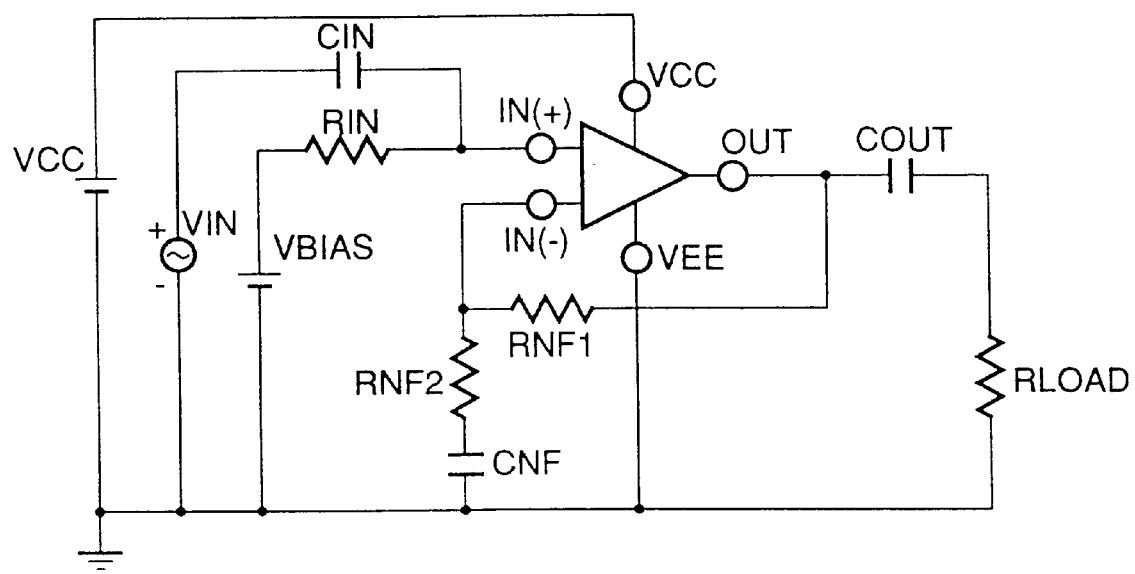
FIG. 7 is a diagram showing a configuration wherein a negative feedback is provided to the differential amplifier shown in FIG. 6 to use it as a voltage amplifier.

FIG. 5 is a diagram showing a configuration obtained by reversing the conductivity of the transistors in the configuration shown in FIG. 1.

Such a configuration makes it possible to reduce variation of the bias current at the output stage while maintaining a current gain inherent to transistors as an emitter-grounded output current amplifying stage. The bias current of this output stage is determined as follows.

When the bias currents of the transistors of the input differential pair are balanced in a non-signal state, the current at each of the inputs and outputs of the current mirror circuit as an active load thereof is biased by a current value which is one-fourth a current value that biases the input differential pair, and the DC voltage at each of the outputs of the active load will be a voltage at a value obtained by adding a voltage drop attributable to the resistor added at the input of the current mirror circuit to the voltage generated as a result of forward bias of the transistors provided by the power supply voltage VCC. Each of the voltages thus generated is received between the base and emitter of the emitter grounded current amplifying stage whose emitters are at the power supply voltage to determine the bias current at the output.

A description will now be made on an AC current gain at an emitter-grounded output current amplifying stage.

A positive feedback of one loop for multiplying a current gain by a factor of 1 is formed by interconnecting the input and output of the current mirror circuit as an active load to maximize the AC impedance at the active load relative to a signal current from the input differential pair and to transmit the signal current from the input differential pair to the subsequent output current amplifying stage with a minimized attenuation.

It is apparent from the above that the current bias at the output stage is determined by matching of the resistors and matching of the base-emitter voltages of the transistors while maintaining a current gain inherent to the transistors as the output current amplifying stage. It is therefore possible to suppress the effect of variation during manufacture unlike circuit described in the example of the prior art wherein the bias current at the output stage depends on matching between the current gains of the transistors. The present embodiment further makes it possible to arbitrarily change the magnitude of the bias current by changing the ratio between the surface areas of the transistors or the ratio of resistance.

Further, the class B push-pull differential amplifier is stable with respect to oscillation because phase compensation is provided for each of the emitter-grounded output current amplifying stages.

A differential amplifier similar to the present embodiment may be provided in which transistors having the same conductivity are used for current driving in upper and lower half cycles to obtain a current gain having preferable linearity.

As described above, while the prior art does not allow sufficient phase compensation because an output current amplifying stage has a non-inverted input which is fed back from the output through a capacity and which does not therefore accommodate phase compensation, the present embodiment makes it possible to achieve sufficient phase compensation with respect to oscillation by providing an inverted signal voltage output which can be fed back to an non-inverted input to an output current amplifying stage using a relatively simple technique.

The present invention makes it possible to provide a differential amplifier which is stable with respect to oscillation and which has less fluctuation of an output current while maintaining a current gain inherent to transistors at a current amplifying stage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A differential amplifier comprising:

an input differential pair constituted by differential pair transistors whose common emitter is current-biased by a negative voltage source through a constant current source;

an active load which is formed by interconnecting through resistors input and output of a first and second current mirror circuit constituted by transistors having conductivity opposite to that of said differential pair whose emitters serve as positive voltage sources and in which a collector output of each of said input differential pair is connected to each of the outputs of said first and second current mirror circuits; and an output current amplifying stage comprising three emitter-grounded current amplifying stages including a first, a second, and a third current amplifying stages which are formed using transistors having the same conductivity as the transistors forming the active load and whose emitters serve as positive voltage sources, the first current amplifying stage including a capacity provided between the base and collector thereof and connected to one of current mirror outputs of said active load at the base thereof, the second and third current amplifying stages being connected to the other current mirror output of said active load at a common base, and each of collectors output, one of collector outputs thereof being connected to a negative voltage source through a resistor with a capacity provided between the base and collector, the other collector output being connected to the input of a third current mirror circuit formed using transistors having the same conductivity as said differential pair transistors whose emitters serve as negative voltage sources, wherein the output of said third current mirror circuit is connected to the output collector of said first current amplifying stage to provide a single-end output.

2. The differential amplifier according to claim 1, wherein a current mirror circuit as a transfer means is provided between said input differential pair and said active load to provide folding in the circuitry.

3. The differential amplifier according to claim 1, wherein a constant current source as a transfer means is provided between said input differential pair and said active load to provide folding in the circuitry.

4. The differential amplifier according to claim 1, wherein base-grounded transistors as a transfer means are provided between said input differential pair and said active load to provide folding in the form of cascade connection in the circuitry.

* * * * *